(12) United States Patent
Essien et al.

(10) Patent No.: US 8,887,658 B2
(45) Date of Patent: Nov. 18, 2014

(54) MULTIPLE SHEATH MULTIPLE CAPILLARY AEROSOL JET

(75) Inventors: Marcelino Essien, Cedar Crest, NM (US); Bruce H. King, Albuquerque, NM (US)

(73) Assignee: Optomec, Inc., Albuquerque, NM (US)

( * ) Notice: Subject to any disclaimer, the term of this patent is extended or adjusted under 35 U.S.C. 154(b) by 885 days.

(21) Appl. No.: 12/247,909

(22) Filed: Oct. 8, 2008

(65) Prior Publication Data
US 2009/0252874 A1    Oct. 8, 2009

Related U.S. Application Data

(60) Provisional application No. 60/978,649, filed on Oct. 9, 2007.

(51) Int. Cl.
| | |
|---|---|
| *B05B 7/00* | (2006.01) |
| *B05C 5/00* | (2006.01) |
| *B05B 7/04* | (2006.01) |
| *H05K 3/12* | (2006.01) |
| *B05B 1/20* | (2006.01) |

(52) U.S. Cl.
CPC ............. *B05B 7/0075* (2013.01); *B05B 7/0491* (2013.01); *H05K 3/1241* (2013.01); *B05B 1/20* (2013.01)
USPC ........... 118/300; 118/313; 118/315; 239/291; 239/296; 239/422

(58) Field of Classification Search
CPC ............................ B05B 7/0491; B05B 7/0075
USPC ............ 118/300, 313–315, 52; 239/398, 290, 239/291, 417.3, 417.5, 419.5, 422, 297, 239/581.1, 581.2, 296
See application file for complete search history.

(56) References Cited

U.S. PATENT DOCUMENTS

| | | |
|---|---|---|
| 3,474,971 A | 10/1969 | Goodrich |
| 3,590,477 A | 7/1971 | Cheroff et al. |
| 3,642,202 A * | 2/1972 | Angelo .............................. 239/8 |
| 3,715,785 A | 2/1973 | Brown et al. |
| 3,808,432 A | 4/1974 | Ashkin |
| 3,808,550 A | 4/1974 | Ashkin |
| 3,846,661 A | 11/1974 | Brown et al. |

(Continued)

FOREIGN PATENT DOCUMENTS

| | | |
|---|---|---|
| DE | 198 41 401 | 4/2000 |
| EP | 0 331 022 A2 | 9/1989 |

(Continued)

OTHER PUBLICATIONS

*Webster's Ninth New Collegiate Dictionary*, Merriam-Webster, Inc., Springifled, MA. USA 1990 , 744.

(Continued)

*Primary Examiner* — Yewebdar Tadesse
(74) *Attorney, Agent, or Firm* — Philip D. Askenazy; Jeffrey D. Myers; Peacock Myers, P.C.

(57) ABSTRACT

Apparatus and method for depositing aerosolized material, wherein an aerosol flow is surrounded and focused by more than one consecutive sheath gas flows. The combined sheath and aerosol flows may consecutively flow through more than one capillary, thereby narrowing the flow further. Linewidths of less than one micron may be achieved.

14 Claims, 5 Drawing Sheets

(56) References Cited

U.S. PATENT DOCUMENTS

| | | |
|---|---|---|
| 3,854,321 A | 12/1974 | Dahneke |
| 3,901,798 A | 8/1975 | Peterson |
| 3,959,798 A | 5/1976 | Hochberg et al. |
| 3,974,769 A | 8/1976 | Hochberg et al. |
| 3,982,251 A | 9/1976 | Hochberg |
| 4,004,733 A | 1/1977 | Law |
| 4,016,417 A | 4/1977 | Benton |
| 4,019,188 A | 4/1977 | Hochberg et al. |
| 4,034,025 A | 7/1977 | Martner |
| 4,036,434 A | 7/1977 | Anderson et al. |
| 4,046,073 A | 9/1977 | Mitchell et al. |
| 4,046,074 A | 9/1977 | Hochberg et al. |
| 4,092,535 A | 5/1978 | Ashkin et al. |
| 4,112,437 A | 9/1978 | Mir et al. |
| 4,132,894 A | 1/1979 | Yule |
| 4,171,096 A | 10/1979 | Welsh et al. |
| 4,200,669 A | 4/1980 | Schaefer et al. |
| 4,228,440 A | 10/1980 | Horike et al. |
| 4,269,868 A | 5/1981 | Livsey |
| 4,323,756 A | 4/1982 | Brown et al. |
| 4,453,803 A | 6/1984 | Hidaka et al. |
| 4,485,387 A | 11/1984 | Drumheller |
| 4,497,692 A | 2/1985 | Gelchinski et al. |
| 4,601,921 A | 7/1986 | Lee |
| 4,605,574 A | 8/1986 | Yonehara et al. |
| 4,670,135 A | 6/1987 | Marple et al. |
| 4,689,052 A | 8/1987 | Ogren et al. |
| 4,823,009 A | 4/1989 | Biemann et al. |
| 4,825,299 A | 4/1989 | Okada et al. |
| 4,826,583 A | 5/1989 | Biernaux et al. |
| 4,893,886 A | 1/1990 | Ashkin et al. |
| 4,904,621 A | 2/1990 | Loewenstein et al. |
| 4,911,365 A | 3/1990 | Thiel et al. |
| 4,917,830 A | 4/1990 | Ortiz et al. |
| 4,920,254 A | 4/1990 | DeCamp et al. |
| 4,947,463 A | 8/1990 | Matsuda et al. |
| 4,997,809 A | 3/1991 | Gupta |
| 5,032,850 A | 7/1991 | Andeen et al. |
| 5,043,548 A | 8/1991 | Whitney et al. |
| 5,064,685 A | 11/1991 | Kestenbaum et al. |
| 5,164,535 A | 11/1992 | Leasure |
| 5,170,890 A | 12/1992 | Wilson et al. |
| 5,176,744 A | 1/1993 | Muller |
| 5,182,430 A | 1/1993 | Lagain |
| 5,194,297 A | 3/1993 | Scheer et al. |
| 5,208,431 A | 5/1993 | Uchiyama et al. |
| 5,245,404 A | 9/1993 | Jannson et al. |
| 5,250,383 A | 10/1993 | Naruse |
| 5,254,832 A | 10/1993 | Gartner et al. |
| 5,270,542 A | 12/1993 | McMurry et al. |
| 5,292,418 A | 3/1994 | Morita et al. |
| 5,322,221 A | 6/1994 | Anderson |
| 5,335,000 A | 8/1994 | Stevens |
| 5,344,676 A | 9/1994 | Kim et al. |
| 5,366,559 A | 11/1994 | Periasamy |
| 5,378,505 A | 1/1995 | Kubota et al. |
| 5,378,508 A | 1/1995 | Castro et al. |
| 5,403,617 A | 4/1995 | Haaland |
| 5,449,536 A | 9/1995 | Funkhouser et al. |
| 5,486,676 A | 1/1996 | Aleshin |
| 5,495,105 A | 2/1996 | Nishimura et al. |
| 5,512,745 A | 4/1996 | Finer et al. |
| 5,607,730 A | 3/1997 | Ranalli |
| 5,609,921 A | 3/1997 | Gitzhofer et al. |
| 5,612,099 A | 3/1997 | Thaler |
| 5,614,252 A | 3/1997 | McMillan et al. |
| 5,648,127 A | 7/1997 | Turchan et al. |
| 5,676,719 A | 10/1997 | Stavropoulos et al. |
| 5,732,885 A | 3/1998 | Huffman |
| 5,733,609 A | 3/1998 | Wang |
| 5,736,195 A | 4/1998 | Haaland |
| 5,742,050 A | 4/1998 | Amirav et al. |
| 5,770,272 A | 6/1998 | Biemann et al. |
| 5,772,106 A | 6/1998 | Ayers et al. |
| 5,772,964 A | 6/1998 | Prevost et al. |
| 5,814,152 A | 9/1998 | Thaler |
| 5,844,192 A | 12/1998 | Wright et al. |
| 5,854,311 A | 12/1998 | Richart |
| 5,861,136 A | 1/1999 | Glicksman et al. |
| 5,882,722 A | 3/1999 | Kydd |
| 5,894,403 A | 4/1999 | Shah et al. |
| 5,940,099 A | 8/1999 | Karlinski |
| 5,958,268 A | 9/1999 | Engelsberg et al. |
| 5,965,212 A | 10/1999 | Dobson et al. |
| 5,980,998 A | 11/1999 | Sharma et al. |
| 5,993,549 A | 11/1999 | Kindler et al. |
| 5,997,956 A | 12/1999 | Hunt et al. |
| 6,007,631 A | 12/1999 | Prentice et al. |
| 6,015,083 A | 1/2000 | Hayes et al. |
| 6,025,037 A | 2/2000 | Wadman et al. |
| 6,036,889 A | 3/2000 | Kydd |
| 6,040,016 A | 3/2000 | Mitani et al. |
| 6,110,144 A | 8/2000 | Choh et al. |
| 6,116,718 A | 9/2000 | Peeters et al. |
| 6,136,442 A | 10/2000 | Wong |
| 6,143,116 A | 11/2000 | Hayashi et al. |
| 6,151,435 A | 11/2000 | Pilloff |
| 6,159,749 A | 12/2000 | Liu |
| 6,182,688 B1 | 2/2001 | Fabre |
| 6,197,366 B1 | 3/2001 | Takamatsu |
| 6,251,488 B1 | 6/2001 | Miller et al. |
| 6,258,733 B1 | 7/2001 | Solayappan et al. |
| 6,265,050 B1 | 7/2001 | Wong et al. |
| 6,267,301 B1 | 7/2001 | Haruch |
| 6,290,342 B1 | 9/2001 | Vo et al. |
| 6,291,088 B1 | 9/2001 | Wong et al. |
| 6,293,659 B1 | 9/2001 | Floyd et al. |
| 6,318,642 B1 | 11/2001 | Goenka et al. |
| 6,340,216 B1 | 1/2002 | Peeters et al. |
| 6,348,687 B1 | 2/2002 | Brockmann et al. |
| 6,349,668 B1 | 2/2002 | Sun et al. |
| 6,379,745 B1 | 4/2002 | Kydd et al. |
| 6,384,365 B1 | 5/2002 | Seth et al. |
| 6,390,115 B1 | 5/2002 | Rohwer et al. |
| 6,391,494 B2 | 5/2002 | Reitz et al. |
| 6,406,137 B1 | 6/2002 | Okazaki et al. |
| 6,416,156 B1 | 7/2002 | Noolandi et al. |
| 6,416,157 B1 | 7/2002 | Peeters et al. |
| 6,416,158 B1 | 7/2002 | Floyd et al. |
| 6,416,159 B1 | 7/2002 | Floyd et al. |
| 6,416,389 B1 | 7/2002 | Perry et al. |
| 6,454,384 B1 | 9/2002 | Peeters et al. |
| 6,467,862 B1 | 10/2002 | Peeters et al. |
| 6,471,327 B2 | 10/2002 | Jagannathan et al. |
| 6,481,074 B1 | 11/2002 | Karlinski |
| 6,503,831 B2 | 1/2003 | Speakman |
| 6,513,736 B1 | 2/2003 | Skeath et al. |
| 6,521,297 B2 | 2/2003 | McDougall et al. |
| 6,537,501 B1 | 3/2003 | Holl et al. |
| 6,544,599 B1 | 4/2003 | Brown et al. |
| 6,548,122 B1 | 4/2003 | Sharma et al. |
| 6,572,033 B1 | 6/2003 | Pullagura et al. |
| 6,573,491 B1 | 6/2003 | Marchitto et al. |
| 6,607,597 B2 | 8/2003 | Sun et al. |
| 6,636,676 B1 | 10/2003 | Renn |
| 6,646,253 B1 | 11/2003 | Rohwer et al. |
| 6,772,649 B2 | 8/2004 | Zimmermann et al. |
| 6,780,377 B2 | 8/2004 | Hall et al. |
| 6,811,805 B2 | 11/2004 | Gilliard et al. |
| 6,823,124 B1 | 11/2004 | Renn et al. |
| 6,890,624 B1 | 5/2005 | Kambe et al. |
| 6,998,785 B1 | 2/2006 | Silfvast et al. |
| 7,045,015 B2 | 5/2006 | Renn et al. |
| 7,108,894 B2 | 9/2006 | Renn |
| 7,270,844 B2 | 9/2007 | Renn |
| 7,294,366 B2 | 11/2007 | Renn et al. |
| 7,485,345 B2 | 2/2009 | Renn et al. |
| 7,674,671 B2 | 3/2010 | Renn et al. |
| 2001/0046551 A1 | 11/2001 | Falck et al. |
| 2002/0012743 A1 | 1/2002 | Sampath et al. |
| 2002/0063117 A1 | 5/2002 | Church et al. |
| 2002/0100416 A1 | 8/2002 | Sun et al. |
| 2002/0132051 A1 | 9/2002 | Choy et al. |
| 2002/0162974 A1 | 11/2002 | Orsini et al. |

(56) References Cited

U.S. PATENT DOCUMENTS

| | | |
|---|---|---|
| 2003/0003241 A1 | 1/2003 | Suzuki et al. |
| 2003/0020768 A1 | 1/2003 | Renn |
| 2003/0108511 A1 | 6/2003 | Sawhney |
| 2003/0108664 A1 | 6/2003 | Kodas et al. |
| 2003/0117691 A1 | 6/2003 | Bi et al. |
| 2003/0138967 A1 | 7/2003 | Hall et al. |
| 2003/0175411 A1 | 9/2003 | Kodas et al. |
| 2003/0180451 A1 | 9/2003 | Kodas et al. |
| 2003/0202032 A1 | 10/2003 | Moffat et al. |
| 2003/0219923 A1 | 11/2003 | Nathan et al. |
| 2003/0228124 A1 | 12/2003 | Renn et al. |
| 2004/0038808 A1 | 2/2004 | Hampden-Smith et al. |
| 2004/0080917 A1 | 4/2004 | Steddom et al. |
| 2004/0151978 A1 | 8/2004 | Huang |
| 2004/0179808 A1 | 9/2004 | Renn |
| 2004/0197493 A1 | 10/2004 | Renn et al. |
| 2004/0247782 A1 | 12/2004 | Hampden-Smith et al. |
| 2005/0002818 A1 | 1/2005 | Ichikawa et al. |
| 2005/0110064 A1 | 5/2005 | Duan et al. |
| 2005/0145968 A1 | 7/2005 | Goela et al. |
| 2005/0147749 A1 | 7/2005 | Liu et al. |
| 2005/0156991 A1 | 7/2005 | Renn |
| 2005/0163917 A1 | 7/2005 | Renn |
| 2005/0205696 A1 | 9/2005 | Saito et al. |
| 2006/0008590 A1 | 1/2006 | King et al. |
| 2006/0046461 A1 | 3/2006 | Benson et al. |
| 2006/0057014 A1 | 3/2006 | Oda et al. |
| 2006/0163570 A1 | 7/2006 | Renn et al. |
| 2006/0172073 A1 | 8/2006 | Groza et al. |
| 2006/0175431 A1 | 8/2006 | Renn et al. |
| 2006/0233953 A1 | 10/2006 | Renn et al. |
| 2006/0280866 A1 | 12/2006 | Marquez et al. |
| 2007/0019028 A1 | 1/2007 | Renn |
| 2007/0128905 A1 | 6/2007 | Speakman |
| 2007/0154634 A1 | 7/2007 | Renn |
| 2007/0181060 A1 | 8/2007 | Renn et al. |
| 2008/0013299 A1 | 1/2008 | Renn |
| 2009/0061077 A1 | 3/2009 | King et al. |
| 2009/0061089 A1 | 3/2009 | King et al. |
| 2009/0090298 A1 | 4/2009 | King et al. |
| 2009/0114151 A1 | 5/2009 | Renn et al. |
| 2010/0173088 A1 | 7/2010 | King |
| 2010/0192847 A1 | 8/2010 | Renn et al. |
| 2010/0255209 A1 | 10/2010 | Renn et al. |
| 2011/0129615 A1 | 6/2011 | Renn et al. |
| 2013/0029032 A1 | 1/2013 | King et al. |
| 2013/0260056 A1 | 10/2013 | Renn et al. |

FOREIGN PATENT DOCUMENTS

| | | |
|---|---|---|
| EP | 0 444 550 A2 | 9/1991 |
| EP | 0470911 | 7/1994 |
| EP | 1 258 293 | 11/2002 |
| JP | 2001-507449 | 6/2001 |
| JP | 2007-507114 | 3/2007 |
| KR | 10-2007-0008614 | 1/2007 |
| KR | 10-2007-0008621 | 1/2007 |
| WO | WO-00/23825 | 4/2000 |
| WO | WO-00/69235 | 11/2000 |
| WO | WO-01/83101 A1 | 11/2001 |
| WO | WO-2006/041657 A2 | 4/2006 |
| WO | WO-2006/065978 A2 | 6/2006 |

OTHER PUBLICATIONS

Ashkin, A., "Acceleration and Trapping of Particles by Radiation Pressure", *Physical Review Letters* Jan. 26, 1970, 156-159.

Ashkin, A., "Optical trapping and manipulation of single cells using infrared laser beams", *Nature* Dec. 1987, 769-771.

Dykhuizen, R. C., "Impact of High Velocity Cold Spray Particles", May 13, 2000, 1-18.

Fernandez De La Mora, J. et al., "Aerodynamic focusing of particles in a carrier gas", *J. Fluid Mech.* vol. 195, printed in Great Britain 1988, 1-21.

King, Bruce et al., "M3D Tm Technology: Maskless Mesoscale Tm Materials Deposition", *Optomec pamphlet* 2001.

Lewandowski, H. J. et al., "Laser Guiding of Microscopic Particles in Hollow Optical Fibers", *Announcer 27, Summer Meeting—Invited and Contributed Abstracts* Jul. 1997, 89.

Marple, V. A. et al., "Inertial, Gravitational, Centrifugal, and Thermal Collection Techniques", *Aerosol Measurement: Principles, Techniques and Applications* 2001, 229-260.

Miller, Doyle et al., "Maskless Mesoscale Materials Deposition", *HDI* vol. 4, No. 9 Sep. 2001, 1-3.

Odde, D. J. et al., "Laser-Based Guidance of Cells Through Hollow Optical Fibers", *The American Society for Cell Biology Thirty-Seventh Annual Meeting* Dec. 17, 1997.

Odde, D. J. et al., "Laser-guided direct writing for applications in biotechnology", *Trends in Biotechnology* Oct. 1999, 385-389.

Rao, N. P. et al., "Aerodynamic Focusing of Particles in Viscous Jets", *J. Aerosol Sci.* vol. 24, No. 7, Pergamon Press, Ltd., Great Britain 1993, 879-892.

Renn, M. J. et al., "Evanescent-wave guiding of atoms in hollow optical fibers", *Physical Review A* Feb. 1996, R648-R651.

Renn, Michael J. et al., "Flow- and Laser-Guided Direct Write of Electronic and Biological Components", *Direct-Write Technologies for Rapid Prototyping Applications* Academic Press 2002, 475-492.

Renn, M. J. et al., "Laser-Guidance and Trapping of Mesoscale Particles in Hollow-Core Optical Fibers", *Physical Review Letters* Feb. 15, 1999, 1574-1577.

Renn, M. J. et al., "Laser-Guided Atoms in Hollow-Core Optical Fibers", *Physical Review Letters* Oct. 30, 1995, 3253-3256.

Renn, M. J. et al., "Optical-dipole-force fiber guiding and heating of atoms", *Physical Review A* May 1997, 3684-3696.

Renn, M. J. et al., "Particle manipulation and surface patterning by laser guidance", *Journal of Vacuum Science & Technology B* Nov./Dec.1998, 3859-3863.

Renn, M. J. et al., "Particle Manipulation and Surface Patterning by Laser Guidance", *Submitted to EIPBN '98, Session AM4* 1998.

Sobeck, et al., "Technical Digest: 1994 Solid-State Sensor and Actuator Workshop", 1994, 647.

TSI Incorporated, "How a Virtual Impactor Works", www.tsi.com Sep. 21, 2001.

Vanheusden, K. et al., "Direct Printing of Interconnect Materials for Organic Electronics", *IMAPS ATW, Printing an Intelligent Future* Mar. 8-10, 2002, 1-5.

Zhang, Xuefeng et al., "A Numerical Characterization of Particle Beam Collimation by an Aerodynamic Lens-Nozzle System: Part I. An Individual Lens or Nozzle", *Aerosol Science and Technology* vol. 36, Taylor and Francis 2002, 617-631.

\* cited by examiner

MULTIPLE SHEATH MULTIPLE CAPILLARY AEROSOL JET

CROSS-REFERENCE TO RELATED APPLICATIONS

This application claims the benefit of the filing of U.S. Provisional Patent Application Ser. No. 60/978,649, entitled "Multiple Sheath Multiple Capillary Aerosol Jet Apparatus," filed on Oct. 9, 2007, and the specification thereof is incorporated herein by reference.

BACKGROUND OF THE INVENTION

Field of the Invention

Technical Field

The present invention generally relates to an apparatus and method for high-resolution, maskless deposition of liquid and liquid-particle suspensions utilizing multiple sheaths to surround an aerosol flow and provide aerodynamic focusing.

BRIEF SUMMARY OF THE INVENTION

The present invention is a method for depositing material, the method comprising the steps of aerosolizing the material to form an aerosol flow, surrounding the aerosol flow with a first sheath gas flow to form a first combined flow, surrounding the first combined flow with a second sheath gas flow to form a second combined flow, passing the second combined flow through at least one first capillary, and depositing the material. The linewidth of the deposited material is between approximately 10 microns and approximately 1 millimeter. The method preferably further comprises the step of passing the first combined flow through a second capillary prior to surrounding the first combined flow with the second sheath gas flow, in which case the linewidth of the deposited material is preferably less than approximately 10 microns, and more preferably less than approximately 1 micron. The orifice diameter of each capillary is preferably between approximately 50 microns and approximately one millimeter. The linewidth of the deposited material is preferably less than approximately 40 times smaller than a capillary orifice size. The method preferably further comprises the step of opening an exhaust valve to prevent the aerosol flow from passing through the first capillary.

The present invention is also an apparatus for depositing material, the apparatus comprising an aerosol inlet, a first sheath gas inlet, a second sheath gas inlet, and at least one first capillary. The apparatus preferably further comprises a second capillary disposed between the first sheath gas inlet and the second sheath gas inlet. The distance between the first capillary and the second capillary is preferably variable. The orifice diameter of each capillary is preferably between approximately 50 microns and approximately one millimeter. The linewidth of deposited material is preferably less than approximately 40 times smaller than the capillary orifice size. The orifice diameter of the first capillary is preferably the same as the orifice diameter of the second capillary. Alternatively, the orifice diameter of the first capillary may be smaller than the orifice diameter of the second capillary. The apparatus preferably further comprises an exhaust valve or a vacuum manifold for preventing the flow of the aerosol from passing through the first capillary. A first apparatus stage comprising the first capillary is optionally stacked in tandem with a second apparatus stage comprising the second capillary.

Objects, advantages and novel features, and further scope of applicability of the present invention will be set forth in part in the detailed description to follow, taken in conjunction with the accompanying drawing, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawing, which is incorporated into and forms a part of the specification, illustrates one or more embodiments of the present invention and, together with the description, serves to explain the principles of the invention. The drawing is only for the purpose of illustrating one or more preferred embodiments of the invention and is not to be construed as limiting the invention. In the drawings.

DETAILED DESCRIPTION OF THE INVENTION

The present invention generally relates to an apparatus and method for high-resolution, maskless deposition of liquid and liquid-particle suspensions using multiple sheaths surrounding an aerosol stream and providing aerodynamic focusing. The conventional embodiment uses an aerosol stream that is focused and deposited onto a planar or non-planar target, forming a pattern that is thermally or photochemically processed to achieve physical, optical, and/or electrical properties near that of the corresponding bulk material. The process is referred to as the $M^3D$® (Maskless Mesoscale Material Deposition) technology, and is used to deposit aerosolized materials with linewidths that can be smaller than one micron, which is orders of magnitude smaller than lines deposited with conventional thick film processes. Deposition is performed without the use of masks.

The $M^3D$ apparatus preferably uses an aerosol jet deposition head to form an annularly propagating jet composed of an outer sheath flow and an inner aerosol-laden carrier flow. In the annular aerosol jetting process, an aerosol carrier gas enters the deposition head, preferably surrounding and entraining the aerosol either directly after the aerosolization process or after it passes through the heater assembly, and is directed along the axis of the device towards the deposition head orifice. The mass throughput is preferably controlled by an aerosol carrier gas mass flow controller. Inside the deposition head, the aerosol stream is preferably initially collimated by passing through a millimeter-size orifice. The emergent particle stream is then preferably combined with an annular sheath gas, which functions to eliminate clogging of the nozzle and to focus the aerosol stream. The carrier gas and the sheath gas most commonly comprise compressed air or an inert gas, where one or both may contain a modified solvent vapor content. For example, when the aerosol is formed from an aqueous solution, water vapor may be added to the carrier gas or the sheath gas to prevent droplet evaporation.

The sheath gas preferably enters through a sheath air inlet below the aerosol inlet and forms an annular flow with the aerosol stream. As with the aerosol carrier gas, the sheath gas flowrate is preferably controlled by a mass flow controller. The combined streams preferably exit the nozzle at a high velocity (for example, approximately 50 m/s) through an orifice directed at a target, and subsequently impinge upon the target. This annular flow focuses the aerosol stream onto the target and allows for deposition of features with dimensions below one millimeter, down to 1 micron and smaller. Patterns are formed by moving the deposition head relative to the target.

Auxiliary Sheath Flows

Figure 1:
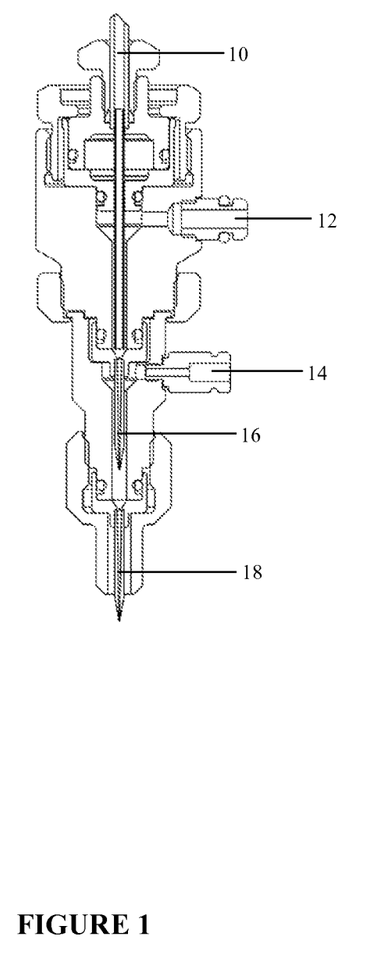
FIG. 1 is a schematic of an embodiment of a dual sheath dual capillary nozzle of the present invention.

An enhancement of the flow characteristics and the deposition characteristics of an annular aerosol jet may be achieved by using auxiliary sheath flows that surround the annular, aerosol-laden primary flow. Each auxiliary sheath flow preferably directs the combined sheath/aerosol flow into an auxiliary capillary. The enhanced flow produces a reduction in overspray and satellite droplets and an increase in the amount of aerodynamic focusing. In the M$^3$D application, the annular flow is injected into a ceramic capillary. In a Dual Sheath Dual Capillary (DSDC) configuration, a secondary sheath gas surrounds the annular jet, and the resulting flow is directed into a second capillary. A schematic of the DSDC aerosol jet is shown in FIG. 1. The aerosol enters the nozzle through port 10 above a chamber, or alternatively from a side-mounted port. The primary and secondary sheaths enter through ports 12 and 14 respectively. The primary sheath focuses the flow and is then injected into primary capillary 16. The secondary sheath then provides secondary focusing of the annular flow and the entire distribution is injected into secondary capillary 18. The configuration of FIG. 1 comprises two focusing stages. The apparatus is designed so that the distance between the capillaries can be varied. The enhanced flow of the DSDC aerosol jet may be extended by using multiple stages, or a Multi-Sheath Multi-Capillary (MSMC) configuration, that employs three or more serial auxiliary sheath flows and capillaries. Linewidths down to 1 micron or less may be achieved using either a Dual Sheath Dual Capillary or a Multi-Sheath Multi-Capillary configuration.

In one embodiment of the present invention, the auxiliary sheath flows are independently controlled. The preferred capillary orifice sizes are approximately 150 or approximately 100 micron diameters, however, in conjunction with the use of serial auxiliary sheath flows and capillaries, orifice diameters as small as approximately 50 microns and as large as approximately 1000 microns or more.

The annular flow developed in the M$^3$D application is generally capable of depositing aerosolized materials with a linewidth of approximately one-tenth the size of the capillary exit orifice. The DSDC configuration is capable of producing linewidths that are less than one tenth of the size of the capillary orifice, down to approximately 40 times smaller than the capillary orifice, and enables direct writing of traces with linewidths as small as approximately 1 micron or less.

Two common problems seen in direct deposition of aerosolized materials using an annular jet are the production of overspray and the occurrence of satellite droplets. Overspray may be broadly defined as extraneous aerosol particles that remain entrained in the carrier gas flow after the gas impacts the substrate and begins to flow laterally along the substrate surface. The droplets may then impact onto the substrate within a few microns from the deposit or as far as tens of microns from the deposited feature. The DSDC nozzle reduces the occurrence of overspray and satellite droplets by increasing the aerodynamic focusing of the aerosol stream.

Multi-Sheath/Single Capillary Flow

Figure 2:
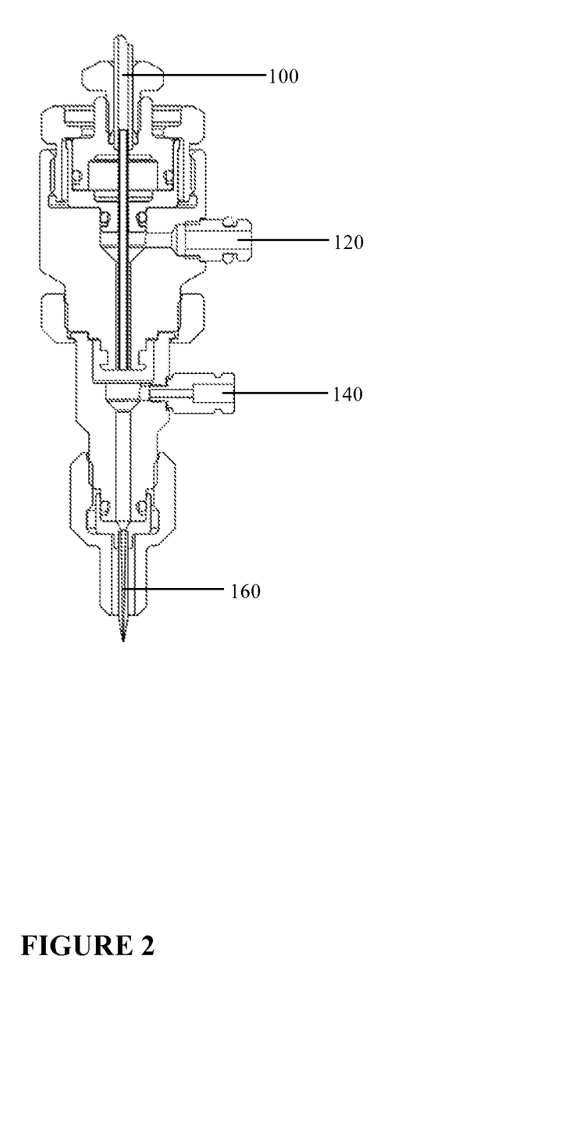
FIG. 2 is a schematic of an embodiment of a dual sheath single capillary deposition head of the present invention.

FIG. 2 shows an embodiment of a configuration of the present invention that passes a dual sheath flow through a single capillary. A Dual Sheath Single Capillary configuration provides secondary focusing of an annular flow distribution comprised of an aerosol and primary sheath flow, but does not introduced the combined flows into a second capillary. The aerosol enters the nozzle from port 100 above a chamber or alternatively from a side-mounted port. The primary and secondary sheaths enter through ports 120 and 140 respectively. The annular flow distribution comprised of an aerosol and primary sheath flow is surrounded by the secondary sheath flow and is injected into single capillary 160. More than two sheath flows may alternatively be employed. The use of a Multi-Sheath/Single Capillary is helpful when depositing aerosols that are prone to impacting onto the inner surfaces of the deposition head. Such impaction is often observed when depositing aerosols formed from volatile, high vapor pressure inks that tend to evaporate during transport to the deposition head. The MSSC configuration provides a secondary sheath gas layer that limits, or in some cases, entirely prevents such impaction of droplets.

Figure 3:
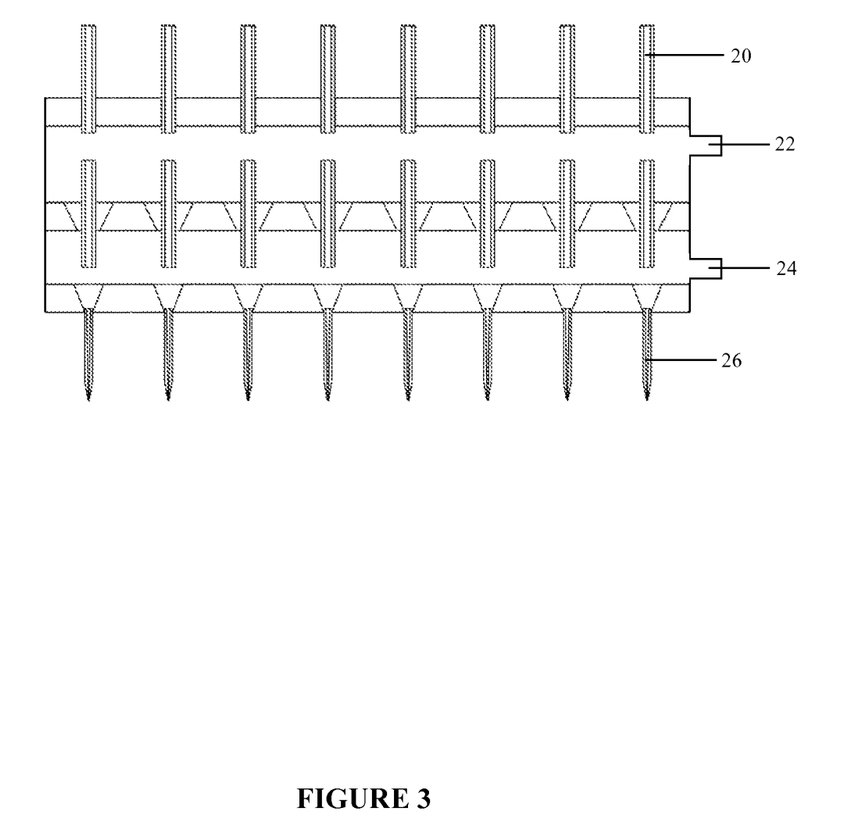
FIG. 3 is a schematic of an embodiment of a dual sheath multinozzle array of the present invention.

A Multi-Sheath/Single Capillary (MSSC) configuration is also advantageous when the length of the deposition head must be minimized, or when the addition of a second capillary stage is problematic or not feasible. An example of one such configuration is a Multi-Nozzle Array, which is an array of two or more capillaries used to simultaneously print parallel lines onto a substrate. In a Multi-Nozzle Array configuration, an aerosol flow is equally distributed to multiple nozzles, typically positioned in the same plane, preferably so that a simultaneous and equal flux of aerosol flows through each capillary of the array. However, the use of nozzle arrays increases the complexity of aerodynamic flow, so that the use of a second stage of arrays or capillaries for the purpose of increased focusing may not be feasible. Increased aerosol focusing may however be obtained using a multiple sheath configuration. In such a design, auxiliary focusing of an aerosol stream is accomplished by developing multiple sheath flows that enter into a capillary array. FIG. 3 is a schematic of a Dual Sheath/Multi-Nozzle Array. The aerosol mist enters each mist tube 20 and is focused by a primary sheath which enters through port 22. Secondary focusing of the aerosol and primary sheath flows is performed by the secondary sheath, which enters through lower port 24, before injection of the distribution into each individual capillary 26 of the array. The increased aerodynamic focusing of the aerosol stream in this configuration enables linewidths as small as approximately 10 microns to be achieved.

Tandem Stage Configuration

Figure 4:
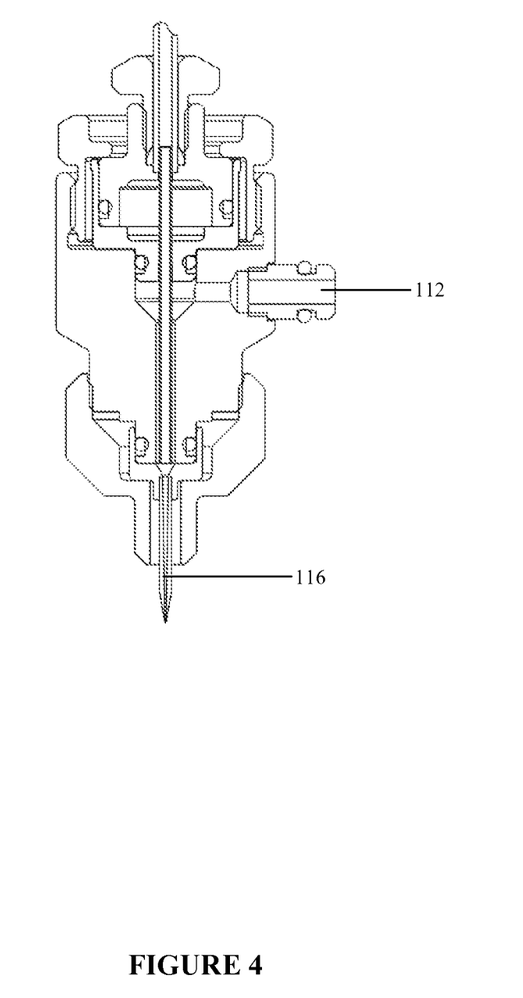
FIG. 4 is a schematic of an embodiment of a single sheath single capillary deposition head of the present invention.

FIG. 4 is a schematic of a stage of a Single Sheath/Single Capillary configuration formed by removing all auxiliary stages. The Single Sheath/Single Capillary configuration is similar to the conventional M$^3$D® deposition head, with the exception of the modification of the lower section of the head, which allows multiple stages to be stacked in tandem, providing increased focusing of the initial annular aerosol jet. In general, each stage is comprised of a single sheath flow that enters through port 112 and single capillary 116. All stages use capillaries having the same diameter. However, in an alternative embodiment, the capillaries can be tapered, resulting in each successive capillary having a smaller diameter than the previous capillary. The use of a tandem configuration increases the range of depositable linewidths for a given capillary diameter. In a tandem configuration, the aerosol flows through each capillary in a serial manner, and is focused to a smaller diameter during transit through each stage. A tandem configuration allows deposition of linewidths as small a 1 micron.

Multi-Sheath/Multi-Capillary Flow

Figure 5:
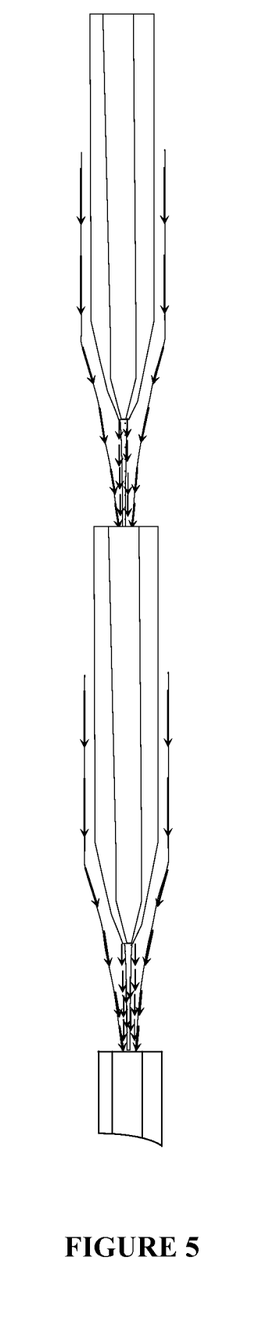
FIG. 5 is a schematic of secondary and tertiary sheath flow configurations in accordance with the present invention.

As an example of the tandem stage principal, the flow enhancements produced by a secondary sheath flow and a secondary capillary may be increased by using additional sheath flows and capillaries. FIG. 5 shows a secondary and tertiary sheath flow configuration where a third sheath gas flow is combined with the primary and secondary sheath flows to produce greater focusing and satellite reduction. The resulting flow is directed into a third capillary. In a similar embodiment, four or more auxiliary sheath flows and capillaries may be used to further increase the aerodynamic focusing properties of an aerosol jet.

Aerodynamic Shuttering

Material shuttering of a multi-sheath aerosol jet may be accomplished by opening an exhaust valve located either between the last two capillaries of the jet, the first capillary of the jet, or the last capillary of the jet. The cross sectional area of the valve is large with respect to the cross sectional area of the final orifice, so that the flow is diverted through the exhaust valve. The exhaust valve would typically precede a vacuum pump. To re-engage aerosol flow, the valve is closed so that the flow is redirected through the length of the jet and through the final exit orifice. Multiple vacuum ports, in the form of a manifold for the vacuum, which pulls on the mist from the mist tube can also be used for shuttering.

This same method and apparatus of material shuttering can be applied to a single sheath system.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An apparatus for depositing material, the apparatus comprising:
   an aerosol inlet;
   a first sheath gas inlet;
   a first stage comprising a first region for forming a first annular flow comprising an aerosol flow surrounded by a first sheath flow, and at least one first passage for transporting said first annular flow;
   a second sheath gas inlet;
   a second stage arranged in series with said first stage, said second stage comprising a second region for forming a combined flow comprising a second sheath flow surrounding said first annular flow, and at least one second passage for transporting said combined flow; and
   at least one exit capillary for receiving said combined flow, said at least one exit capillary configured to focus the combined flow sufficiently to deposit material in the aerosol with a linewidth less than an orifice diameter of said at least one exit capillary.

2. The apparatus of claim 1 wherein an orifice diameter of each said exit capillary is between approximately 50 microns and approximately one millimeter.

3. The apparatus of claim 1 wherein a linewidth of deposited material is less than approximately 40 times smaller than a capillary orifice size.

4. The apparatus of claim 1 further comprising an exhaust valve or a vacuum manifold for preventing a flow of the aerosol from passing through said at least one exit capillary.

5. The apparatus of claim 1 comprising a plurality of exit capillaries.

6. An apparatus for depositing material, the apparatus comprising:
   an aerosol inlet;
   a first sheath gas inlet;
   a first region for forming an annular flow comprising an aerosol flow surrounded by a first sheath flow;
   a second sheath gas inlet;
   an intermediate capillary for receiving said annular flow, said intermediate capillary disposed between said first sheath gas inlet and said second sheath gas inlet;
   a second region for forming a combined flow comprising a second sheath flow surrounding said annular flow; and
   an exit capillary for receiving said combined flow.

7. The apparatus of claim 6 wherein a distance between said exit capillary and said intermediate capillary is variable.

8. The apparatus of claim 6 wherein an orifice diameter of each capillary is between approximately 50 microns and approximately one millimeter.

9. The apparatus of claim 6 wherein a linewidth of deposited material is less than approximately 40 times smaller than a capillary orifice size.

10. The apparatus of claim 6 wherein an orifice diameter of said exit capillary is the same as an orifice diameter of said intermediate capillary.

11. The apparatus of claim 6 wherein an orifice diameter of said exit capillary is smaller than an orifice diameter of said intermediate capillary.

12. The apparatus of claim 6 further comprising an exhaust valve or a vacuum manifold for preventing a flow of the aerosol from passing through said exit capillary.

13. The apparatus of claim 6 wherein an exit apparatus stage comprising said exit capillary is stacked in tandem with an intermediate apparatus stage comprising said intermediate capillary.

14. The apparatus of claim 6 comprising a plurality of exit capillaries.

* * * * *